(12) United States Patent
Hu (10) Patent No.: US 12,210,053 B2
(45) Date of Patent: Jan. 28, 2025

(54) SEMICONDUCTOR DEVICE

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 205 days.

(21) Appl. No.: 18/084,561

(22) Filed: Dec. 20, 2022

(65) Prior Publication Data

US 2023/0117207 A1 Apr. 20, 2023

Related U.S. Application Data (63) Continuation-in-part of application No. 17/197,044, filed on Mar. 10, 2021, now Pat. No. 11,567,122.

(60) Provisional application No. 63/002,276, filed on Mar. 30, 2020.

(51) Int. Cl.
| | |
|---|---|
| *G01R 31/28* | (2006.01) |
| *G01R 1/04* | (2006.01) |
| *G01R 1/067* | (2006.01) |
| *G01R 1/073* | (2006.01) |
| *G01R 31/26* | (2020.01) |
| *H01L 23/00* | (2006.01) |
| *H01L 23/29* | (2006.01) |
| *H01L 23/31* | (2006.01) |
| *H01L 23/52* | (2006.01) |

(52) U.S. Cl.
CPC .................................. *G01R 31/26* (2013.01)

(58) Field of Classification Search
CPC .......... G01R 31/26; G01R 31/28; G01R 1/04; G01R 1/067; G01R 1/073; H01L 23/00; H01L 23/29; H01L 23/31; H01L 23/52; H01L 23/522; H01L 23/528; H01L 23/538; H01L 23/56
See application file for complete search history.

(56) References Cited

U.S. PATENT DOCUMENTS

| | | | |
|---|---|---|---|
| 10,937,736 B2 * | 3/2021 | Yu ........................ | H01L 23/145 |
| 2019/0120877 A1 * | 4/2019 | Wei .................... | G01R 31/2889 |
| 2021/0096173 A1 * | 4/2021 | Chen ................. | G01R 31/2886 |

* cited by examiner

*Primary Examiner* — Neel D Shah
(74) *Attorney, Agent, or Firm* — JCIPRNET (57) ABSTRACT

A semiconductor device for testing a device under test includes a circuit board, a plurality of probes disposed below the circuit board and facing the device under test, an integrated substrate disposed between the circuit board and the plurality of probes, and signal-transmitting module disposed on the circuit board and next to the integrated substrate. The plurality of probes is electrically coupled to the circuit board through the integrated substrate, and the signal-transmitting module transmits a test signal to the plurality of probes through the integrated substrate and the circuit board to perform a test to the device under test. Another semiconductor device including the integrated substrate and a manufacturing method thereof are provided.

12 Claims, 8 Drawing Sheets

SEMICONDUCTOR DEVICE

CROSS REFERENCE TO RELATED APPLICATION

This application is a continuation-in-part application of and claims the priority benefit of U.S. patent application Ser. No. 17/197,044, filed on Mar. 10, 2021. The prior application Ser. No. 17/197,044 claims the priority benefit of U.S. provisional application Ser. No. 63/002,276, filed on Mar. 30, 2020. The entirety of each of the above-mentioned patent applications is hereby incorporated by reference herein and made a part of specification.

BACKGROUND

Technical Field

The disclosure relates to a semiconductor device, and more particularly to a semiconductor device including an integrated substrate.

Description of Related Art

Generally speaking, after the wafer is manufactured, the tester is used to test the electrical performance of each chip in the wafer. The conventional tester is very bulky and complex and also lacks the flexibility to integrate test signals. Currently, the testing speed of semiconductor wafers is rapidly increasing, but the conventional tester does not support the use of radio frequency (RF) signals and/or high-speed digital signals to test the device under test (DUT). Therefore, how to develop a tester that is both lightweight and efficient and can support transmission of RF signals and/or high-speed digital signals for testing the DUT is one of the important research and development topics in the semiconductor industry and its related electronic industries.

In addition, with the vigorous development of the electronics industries, there is an increasing demand for high performance computing (HPC) systems that can complete complex or large amounts of computing work in a short time. Therefore, as the chip size continues to shrink, providing a HPC system that can well integrate various semiconductor chips is another one of the important research and development topics in the semiconductor industry and its related electronic industries.

SUMMARY

The disclosure provides a semiconductor device adapted for testing a semiconductor wafer, which shortens the transmission path of the test signals, thereby obtaining better signal transmission quality, so that the test signals received by the device under test is not distorted and has better signal transmission quality and integrity.

A semiconductor device for testing a semiconductor wafer of the disclosure includes a circuit board, a probe disposed below the circuit board and facing the semiconductor wafer, an integrated substrate disposed between the circuit board and the probe, a signal-transmitting module disposed on the circuit board and next to the integrated substrate. The probe is electrically coupled to the circuit board through the integrated substrate, and the signal-transmitting module transmits a test signal to the probe through the integrated substrate and the circuit board to perform a test to the semiconductor wafer.

In some embodiments, the signal-transmitting module comprises an optical-electrical converter and an optical fiber connected to the optical-electrical converter. In some embodiments, the signal-transmitting module comprises a radio frequency component. In some embodiments, the semiconductor device includes a power supply component disposed on and electrically connected to the circuit board, where the power supply component and the signal-transmitting module are at two opposite sides of the circuit board. In some embodiments, the integrated substrate includes a space transformer, and the space transformer includes a coarse-pitched circuit layer and a fine-pitched circuit layer, the coarse-pitched circuit layer is disposed on a side close to the circuit board and connected to the circuit board, and the fine-pitched circuit layer is connected to the coarse-pitched circuit layer and disposed on a side close to the probe, where a dimension of the coarse-pitched circuit layer is greater than that of the fine-pitched circuit layer.

The disclosure also provides a semiconductor device that is connected to a chip in an optical manner to transmit signals, so as to solve the bottleneck problems such as limited speed and bandwidth in traditional electrical transmission.

A semiconductor device of the disclosure includes an integrated substrate, a plurality of chips, and an optical fiber. The integrated substrate includes a first redistribution layer, a second redistribution layer, and a plurality of third redistribution segments, the first redistribution layer includes a coarse-pitched circuit layer, a second redistribution layer is disposed on the first redistribution layer and includes a fine-pitched circuit layer, where the fine-pitched circuit layer is electrically connected to the coarse-pitched circuit layer, the third redistribution segments are respectively embedded in the second redistribution layer, each of the third redistribution segments includes an ultra-fine-pitched circuit layer, where the ultra-fine-pitched circuit layer is electrically connected to the fine-pitched circuit layer, a dimension of the coarse-pitched circuit layer is greater than a dimension of the fine-pitched circuit layer, and the dimension of the fine-pitched circuit layer is greater than a dimension of the ultra-fine-pitched circuit layer. The chips are disposed on the integrated substrate and includes an optical-electrical (OE) chip disposed on the third redistribution segments of the integrated substrate and a networking chip disposed on the second redistribution layer of the integrated substrate, and the optical fiber is disposed on the integrated substrate and connected to the OE chip and the networking chip.

In some embodiments, the chips further includes a first chip and a second chip, the first chip is disposed next to the OE chip and interconnects to the OE chip through the ultra-fine-pitched circuit layer of one of the third redistribution segments of the integrated substrate, and the second chip is disposed next to the first chip and interconnects the first chip through another one of the third redistribution segments of the integrated substrate. In some embodiments, a gap is between the OE chip and the first chip, the one of the third redistribution segments of the integrated substrate is below the gap and extends toward the OE chip and the first chip to partially overlap the OE chip and the first chip, and another gap is between the second chip and the first chip, the another one of the third redistribution segments of the integrated substrate is below the another gap and extends toward the second chip and the first chip to partially overlap the second chip and the first chip. In some embodiments, the first chip is a processor chip, the second chip is a memory chip, the OE chip is at one side of the processor chip, and a plurality of the memory chips are arranged at other sides of the processor chip. In some embodiments, the semiconductor device further includes a circuit board and a plurality of solder balls, the a circuit board is disposed below the integrated substrate and opposite to the chips, and the solder balls are disposed between the first redistribution layer of the integrated substrate and the circuit board to electrically connect the integrated substrate and the circuit board.

Based on the above, the semiconductor device of the disclosure may be applied to test semiconductor wafers by arranging the signal-transmitting module on the side close to the semiconductor wafer to shorten the signal transmission path. In addition, the signal-transmitting module may improve the integrity and transmission speed of the test signals through suitable coupling mechanisms (e.g., optical coupling and electrical coupling, radio frequency transmission). On the other hand, the semiconductor device of the disclosure may also be used in a high performance computing system by arranging the optical fiber on the integrated substrate to use optical signals as a signal transmission medium, thereby realizing high-bandwidth and high-performance information transmission.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
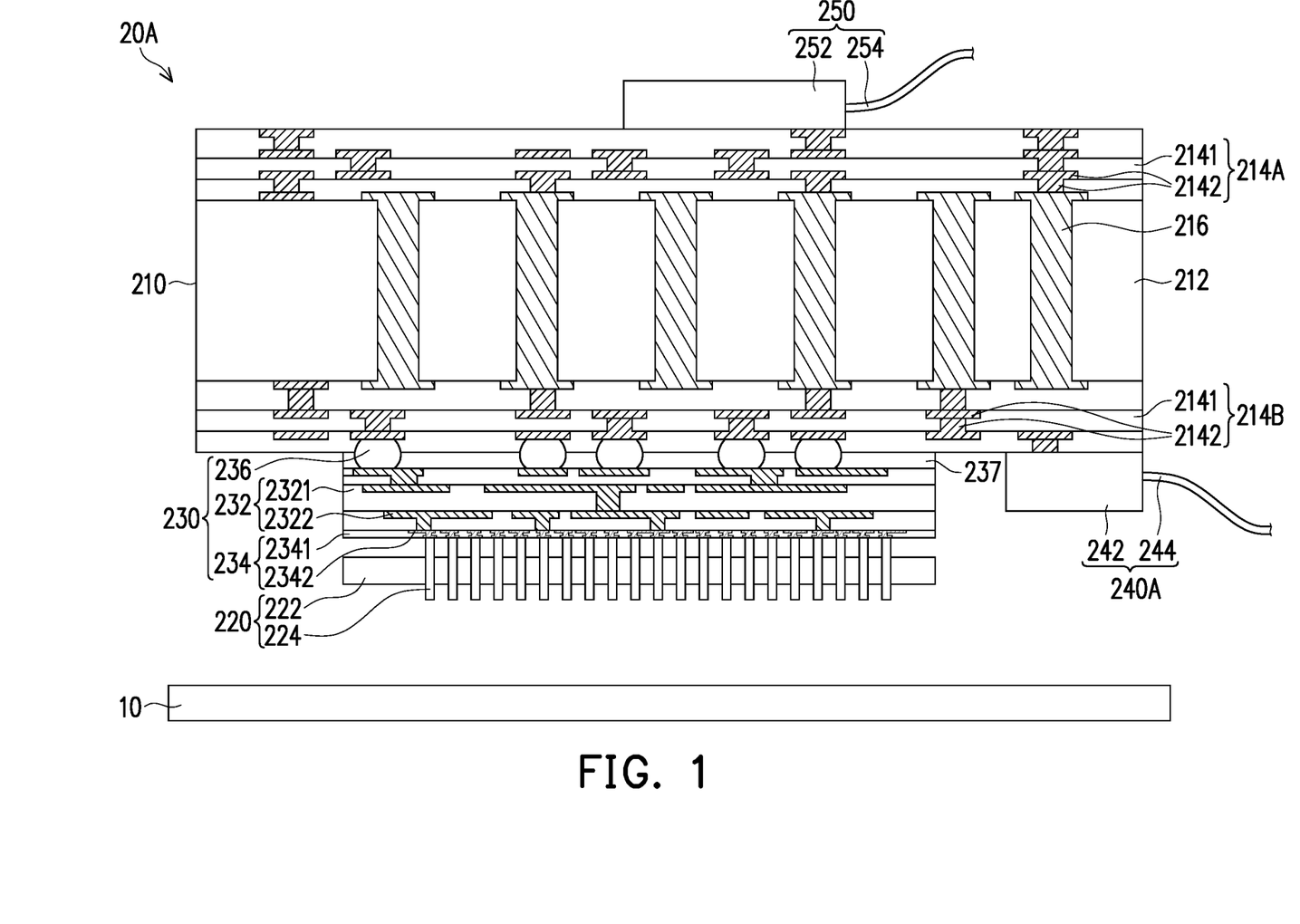
FIG. 1 is a schematic cross-sectional view of a semiconductor device for testing a semiconductor wafer according to some embodiments of the present invention.

FIG. 1 is a schematic cross-sectional view of a semiconductor device for testing a semiconductor wafer according to some embodiments of the present invention. Referring to FIG. 1, a semiconductor device 20A adapted for testing a semiconductor wafer 10 is provided, where the semiconductor wafer 10 may also be viewed as a device under test (DUT). In other embodiments, the semiconductor device 20A may adapt for test a heterogeneous package structure (not shown) which includes a plurality of chips (not shown) mounted on a substrate (not shown). In some embodiments, the semiconductor device 20A includes a circuit board 210, the probe holder 220, an integrated substrate 230 disposed between the circuit board 210 and the probe holder 220, and a signal-transmitting module 240A disposed on the circuit board 210 and next to the integrated substrate 230. In some embodiments, the probe holder 220 is disposed below the circuit board 210, and the probe holder 220 includes a holder body 222 and a plurality of probes 224 penetrating through the holder body 222 and facing the semiconductor wafer 10. The probes 224 may be made of conductive material(s) and electrically connected to the circuit board 210 through the integrated substrate 230. In some embodiments, the signal-transmitting module 240A is configured to transmit test signals to the probe 224 through the circuit board 210 and the integrated substrate 230 for testing the semiconductor wafer 10.

The circuit board 210 may provide the integrated substrate 230 structural and mechanical supports, for example, the circuit board 210 may be a printed circuit board (PCB) or may be a multi-layered ceramic substrate to facilitate testing in the harsh environment; however, the type of the circuit board construes no limitation in the disclosure. For example, the circuit board 210 includes a core dielectric layer 212, build-up structures 214A and 214B disposed at two opposite sides of the core dielectric layer 212, and conductive through holes 216 penetrating through the core dielectric layer 212. The conductive through holes 216 provide vertical conductive paths, so that the build-up structures 214A and 214B disposed at the two opposing sides of the core dielectric layer 212 may be electrically coupled to each other through the conductive through holes 216. The respective build-up structure 214A and 214B may include dielectric layers 2141 and circuit layers 2142 sequentially stacked on the core dielectric layer 212. The circuit layers 2142 may include conductive features such as conductive lines, conductive vias, and conductive pads. In some embodiments, the material(s) of the dielectric layers 2141 include prepreg (PP), Ajinomoto build-up film (ABF) and/or other suitable dielectric material(s). The material(s) of the circuit layers 2142 may include copper or other suitable conductive material(s). The number of the dielectric layers 2141 and the number of the circuit layers 2142 of the build-up structures 214A and 214B may be adjusted and vary according to actual circuit design requirements.

The integrated substrate 230 may be or may include a space transformer. For example, the integrated substrate 230 includes a first redistribution layer (RDL) 232, a second RDL 234 disposed at a side of the first RDL 232, and connectors 236 connected to the first RDL 232 and the build-up structure 214B of the circuit board 210. The first RDL 232 may include dielectric layers 2321 and coarse-pitched circuit layers 2322 stacked in sequence, where the coarse-pitched circuit layers 2322 may include conductive features such as conductive lines, conductive vias, and conductive pads. The second RDL 234 may also include dielectric layers 2341 and fine-pitched circuit layers 2342 stacked in sequence, where the fine-pitched circuit layers 2342 may include conductive features such as conductive lines, conductive vias, and conductive pads. The connectors 236 may include solder balls, conductive bumps, ball grid arrays (BGA), and/or other suitable conductive terminals for connecting the coarse-pitched circuit layer 2322 of the first RDL 232 and the circuit layer 2142 of the circuit board 210. An underfill 237 may be optionally disposed between the build-up structure 214B of the circuit board 210 and the first RDL 232 of the integrated substrate 230 to laterally cover the connectors 236 for protection.

In some embodiments, the coarse-pitched circuit layers 2322 of the first RDL 232 are disposed at the side close to the circuit board 210 and electrically connected to the circuit layers 2142 of the circuit board 210 through the connector 236, and the fine-pitched circuit layers 2342 of the second RDL 234 are connected to the coarse-pitched circuit layers 2322 and disposed at the side close to the probe holder 220. The dimensions of the conductive features (e.g., conductive lines, conductive vias, and conductive pads) of the coarse-pitched circuit layers 2322 may be greater than the dimensions of the conductive features (e.g., conductive lines, conductive vias, and conductive pads) of the fine-pitched circuit layers 2342, respectively. For example, the line/spacing (L/S) of the conductive features of the coarse-pitched circuit layers 2322 is greater than the line/spacing of the conductive features of the fine-pitched circuit layers 2342. The wiring layout density of the coarse-pitched circuit layer 2322 in a unit area may be less than the wiring layout density of the fine-pitched circuit layer 2342 in the same unit area. It should be understood that the circuit board 210 and the integrated substrate 230 shown in FIG. 1 are only shown in a schematic manner, and the specific structures may be adjusted and vary according to design requirements, which are not limited thereto. In other embodiment, the integrated substrate 230 in FIG. 1 may include a plurality of third redistribution segments (not shown) embedded in the second RDL 234 similar as the third redistribution segments 130 shown in FIG. 3 (referring to FIG. 3 for detail description).

In some embodiments, one end of the respective probe 224 may be physically and electrically connected to the fine-pitched circuit layer 2342, and the other end of the respective probe 224 may be aligned with a test point (not shown) on the semiconductor wafer 10 and may be in contact with the test point during the test operation, so that the test signals may be transmitted to the semiconductor wafer 10 through the probes 224 or the test signals may be transmitted from the semiconductor wafer 10 to the probe 224. The pitches of the fine-pitched circuit layer 2342 may match the pitches of the probe 224, and the pitches of the probe 224 may match the pitches of the test points of the semiconductor wafer 10. The probes 224 are arranged in a high-density manner to be in contact with the densely distributed test points on the semiconductor wafer 10, thereby performing a good and reliable test. In the present embodiment, the probe holder 220 can be detached from the integrated substrate 230, so that once the probes 224 are broken, the probe holder 220 can be replaced easily.

In some embodiment, the integrated substrate 230 is replaceable by removing the connector 236, so that the semiconductor device 20A can be flexibly applied to testing of various DUTs and once the integrated substrate 230 is broken, it is easily been replaced.

Still referring to FIG. 1, the integrated substrate 230 may be disposed in the central area of the circuit board 210, and the signal-transmitting module 240A may be disposed in the peripheral area of the circuit board 210 and beside the integrated substrate 230. In some embodiments, the signal-transmitting module 240A includes an optical-electrical (OE) converter 242 and an optical fiber 244 optically coupled to the OE converter 242, where the optical fiber 244 may be connected to a tester (not shown). By using the optical fiber 244 to transmit the test signals of the tester to and from the circuitry, the energy conversion between the optical fiber 244 and the circuitry may be performed by the OE converter 242. For example, the OE converter 242 may be physically and electrically connected to the circuit layers 2142 of the build-up structure 214B. By such configuration, the test signals transmitted by the signal-transmitting module 240A may be directly transmitted to the probes 224 through the circuit layers 2142 of the build-up structure 214B and the integrated substrate 230, and the test is performed by contacting the probes 224 to the test points of the semiconductor wafer 10, thereby reducing the distance of the signal transmission. In other embodiments, the OE converter 242 may be embedded in the circuit board 210 to shorten the signal transmission distance to the integrated substrate 230. The signal-transmitting module 240A may further include controller(s), passive component(s), discrete component(s), etc., or may be replaced with other suitable signal-transmitting technique(s), so as to achieve the programs of transmitting the test signals from the tester to the semiconductor wafer 10 or transmitting the feedback signals from the semiconductor wafer 10 to the tester.

In some embodiments, the semiconductor device 20A further includes a power supply module 250 which may include a power supply 252 and a cable 254. For example, the cable 254 may be connected to the tester and the power supply 252 to provide the conductive path for power (and ground). The power supply 252 may be disposed on the circuit board 210 and electrically coupled to the build-up structure 214A of the circuit board 210, where the power supply 252 and the OE converter 242 may be disposed at two opposite sides of the circuit board 210 to be physically and electrically connected to the build-up structures 214A and 214B, respectively. The power supply module 250 may include other suitable components to provide the desired voltage and power to the circuit board 210, but which is not limited thereto.

Figure 2:
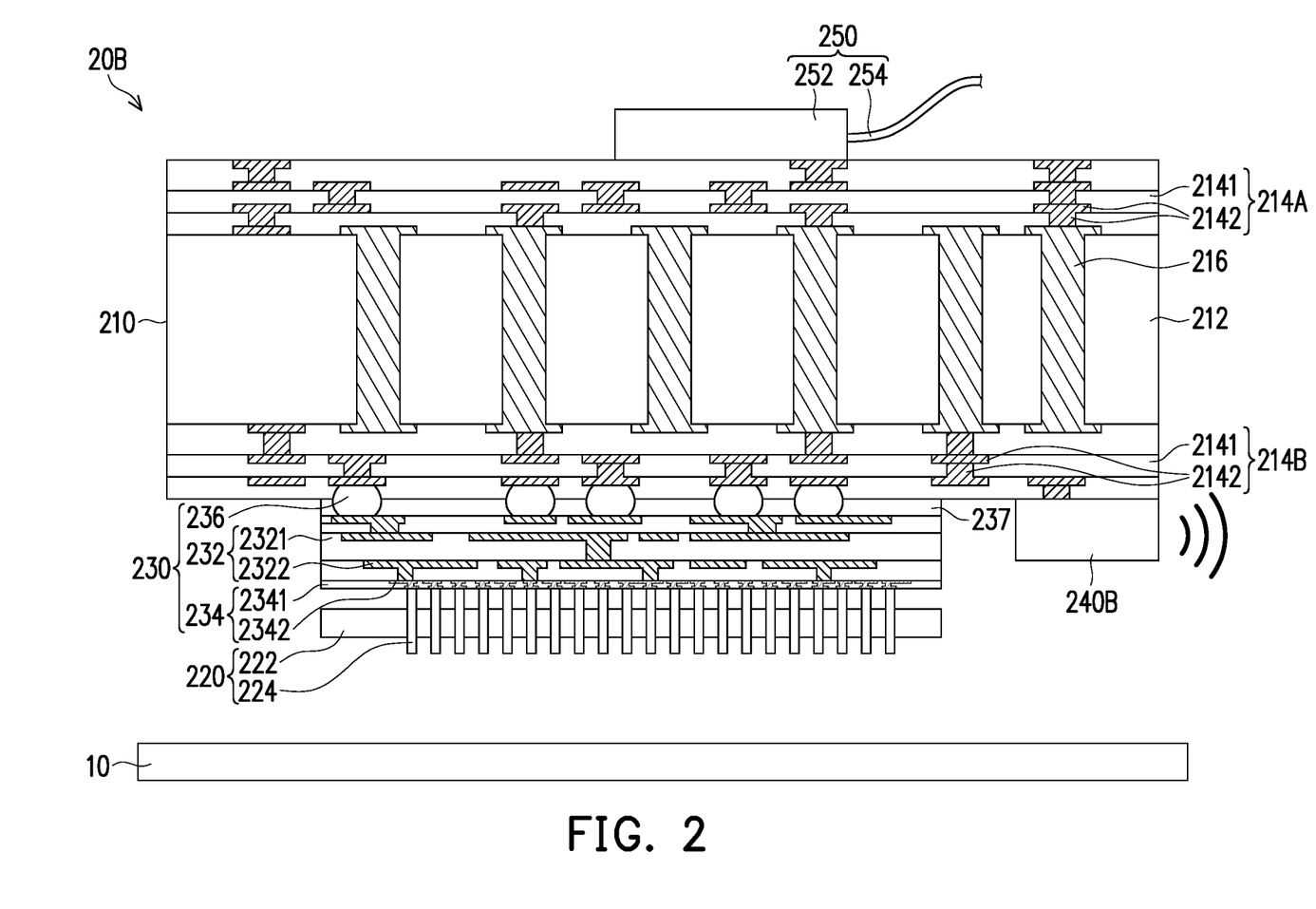
FIG. 2 is a schematic cross-sectional view of a semiconductor device for testing semiconductor wafers according to other embodiments of the present invention.

FIG. 2 is a schematic cross-sectional view of a semiconductor device for testing semiconductor wafers according to other embodiments of the present invention. The semiconductor device 20B used to test the semiconductor wafer 10 shown in FIG. 2 may be similar to the semiconductor device 20A shown in FIG. 1, so the same/similar reference numerals are used to refer to the same/similar components, and the details of these same/similar components are not repeated herein. Referring to FIG. 2, the difference between the semiconductor device 20B and the semiconductor device 20A shown in FIG. 1 lies in that the signal-transmitting module 240B of the semiconductor device 20B is configured to use non-contact wireless transmission to achieve signal communication with the tester.

The tester may be configured to transmit the test signals to the signal-transmitting module 240B to test the execution performance or electrical performance of the semiconductor wafer 10. For example, the signal-transmitting module 240B includes a high-bandwidth radio frequency (RF) component disposed on the side of the circuit board 210 close to the semiconductor wafer 10. The RF component may be coupled to the circuit board 210, and the RF component may include an antenna, a radio frequency circuit, an amplifier, a passive element and/or any suitable signal-transmitting element. The RF technique is used to transmit the test signals from the tester to the RF component. After the test signals are received by the antenna of the RF element, the test signals may be transmitted to the probes 224 via the circuit board 210 and the integrated substrate 230, thereby performing the electrical test on the semiconductor wafer 10. The test results of the semiconductor wafer 10 may also be transmitted back to the tester through the probes 224, the integrated substrate 230, the circuit board 210, and the RF component so as to analyze the test results. For example, sending the test signals to the tester may include modulating the impedance of the antenna to radiate the RF signals containing the information of the test signals. By using the signal-transmitting module 240B, the tester may be configured to quickly and effectively transmit various test information and test signals. In other embodiments, the signal-transmitting module 240B may also use microwave, infrared, magnetic coupling, or the like to transmit test signals and/or receive feedback signals. In this manner, various wires and cables that were used to be connected to the tester to transmit the signals may be simplified or omitted, and the signal-transmitting module 240B is used to achieve a large amount of and fast information and signal transmission.

Figure 3:
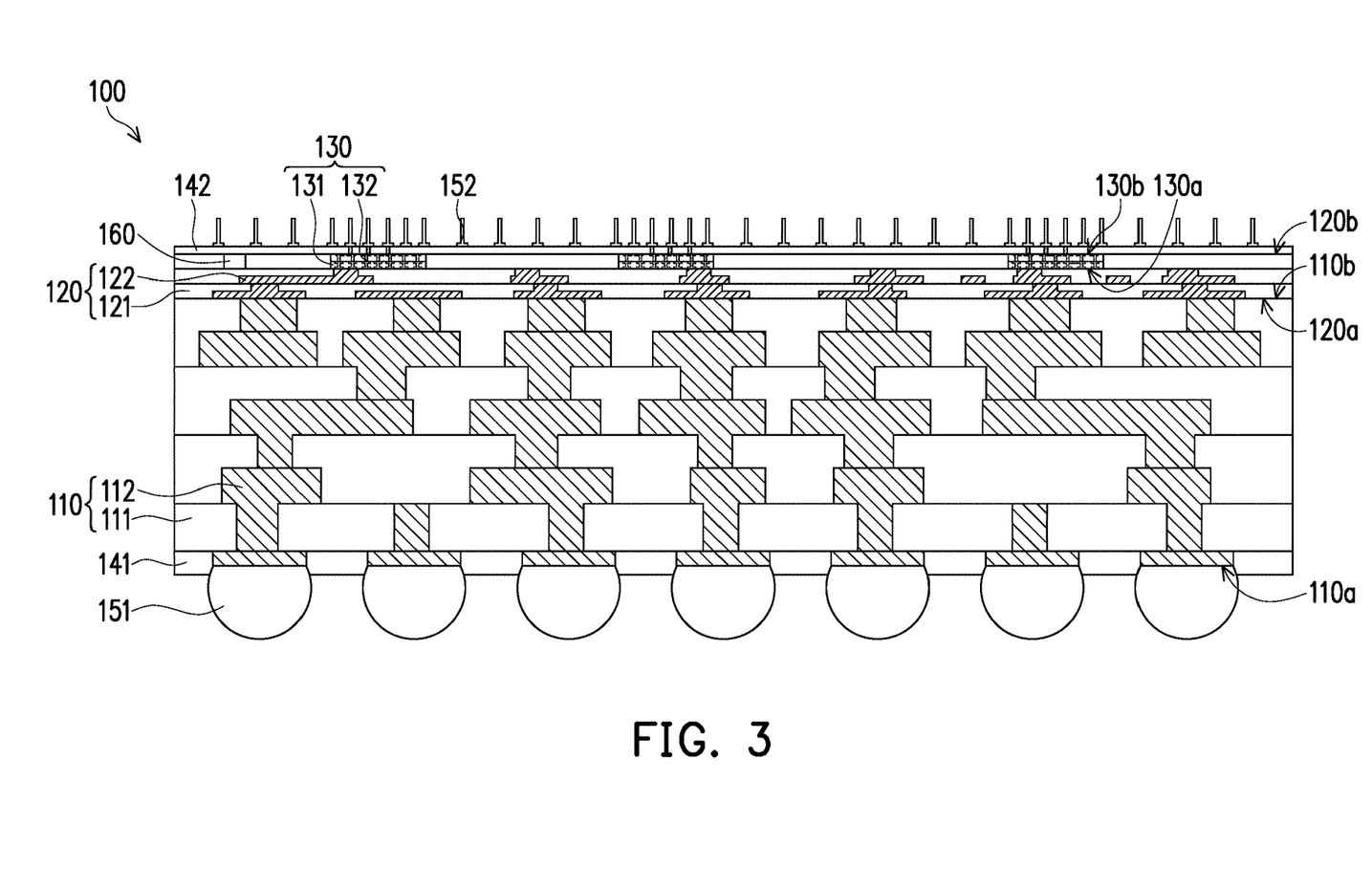
FIG. 3 is a schematic cross-sectional view of an integrated substrate according to some embodiments of the present invention.
Figure 4:
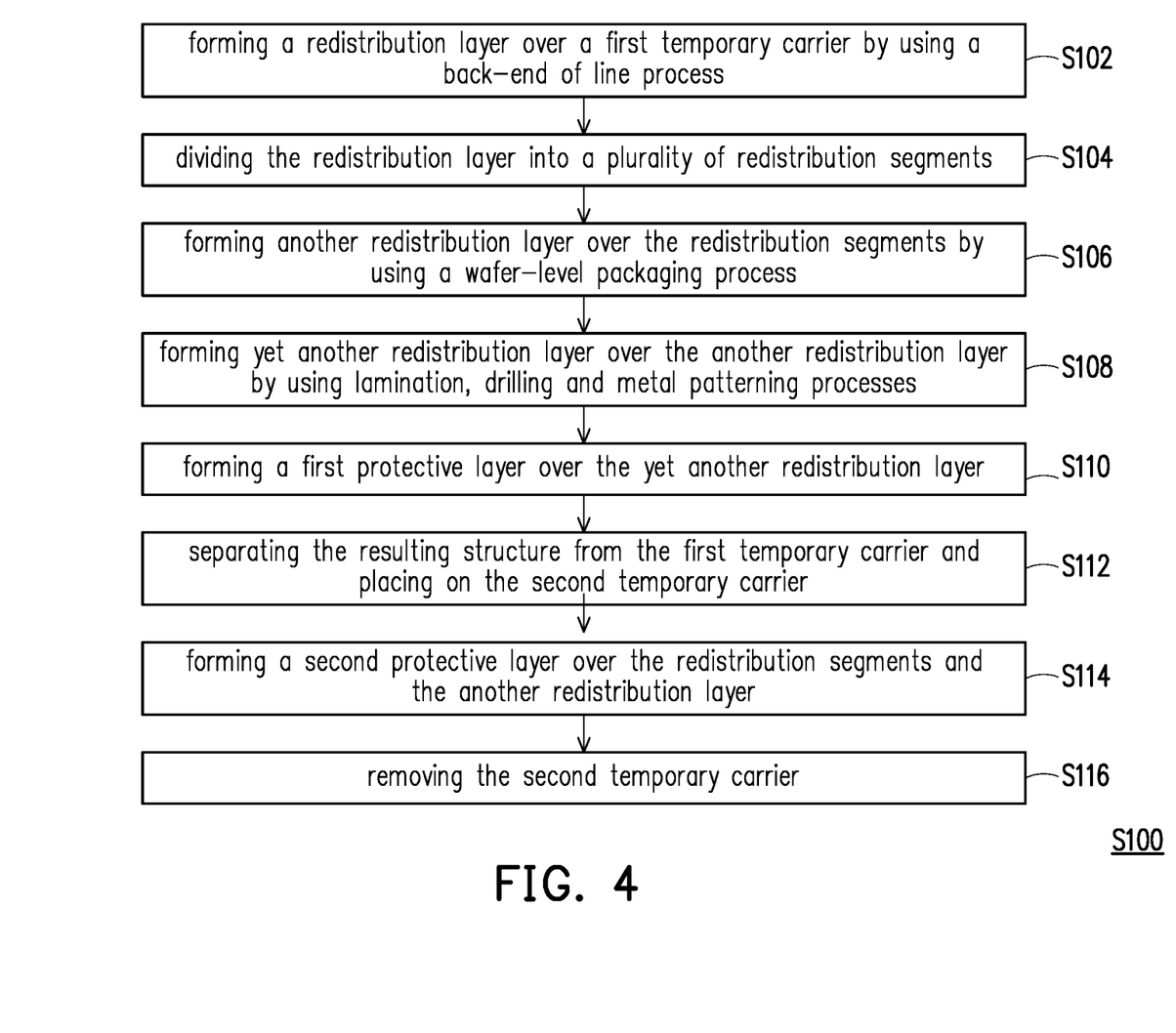
FIG. 4 is a schematic diagram of a manufacturing process of an integrated substrate according to some embodiments of the present invention.

FIG. 3 is a schematic cross-sectional view of an integrated substrate according to some embodiments of the present invention, and FIG. 4 is a schematic diagram of a manufacturing process of an integrated substrate according to some embodiments of the present invention. Referring to FIG. 3 first, the integrated substrate 100 may include a first redistribution layer (RDL) 110, a second RDL 120 stacked on the first RDL 110, and a plurality of third redistribution segments 130, where the third redistribution segments 130 may be spatially separated from one another and respectively embedded in the second RDL 120, and these third redistribution segments 130 may be disposed on a side of the second RDL 120 away from the first RDL 110. It should be understood that the number and the layout of the first RDL 110, the second RDL 120, and the third redistribution segments 130 shown in FIG. 3 are only for illustration, and may be adjusted according to actual circuit design requirements, which construe no limitation in the disclosure.

The first RDL 110, the second RDL 120, and the third redistribution segments 130 may respectively include first sides (110a, 120a, and 130a) and second sides (110b, 120b, and 130b) opposite to each other, where the second side 110b of the first RDL 110 may be physically connected to the first side 120a of the second RDL 120, the second side 120b of the second RDL 120 may be coplanar with the second sides 130b of the third redistribution segments 130, and the first sides 130a of these third redistribution segments 130 are between the first side 120a and the second side 120b of the second RDL 120. In some embodiments, the first side 110a of the first RDL 110 is referred to as the circuit board end of the integrated substrate 100, and the second side 120b of the second RDL 120 and the second sides 130b of these third redistribution segments 130 coplanar with the second side 120b of the second RDL 120 may be referred to as the chip end of the integrated substrate 100.

In some embodiments, the respective third redistribution segment 130 includes dielectric layers 131 and ultra-fine-pitched circuit layers 132 stacked in sequence, where the ultra-fine-pitched circuit layers 132 may include conductive features such as conductive lines, conductive vias, and conductive pads. For example, the material(s) of the dielectric layers 131 may include silicon oxide, silicon nitride, and/or other suitable non-organic dielectric material(s), and the material(s) of the ultra-fine-pitched circuit layers 132 may include copper, copper alloy or other suitable conductive material(s). In some embodiments, the second RDL 120 includes dielectric layers 121 and fine-pitched circuit layers 122 stacked in sequence, where the fine-pitched circuit layers 122 may include conductive features such as conductive lines, conductive vias, and conductive pads. The sidewall and the first side 130a of the respective third redistribution segment 130 may be covered by the dielectric layer 121 of the second RDL 120. For example, the sidewall of the dielectric layer 131 of each third redistribution segment 130 may be in direct contact with the sidewall of the dielectric layer 121 of the second RDL 120. The ultra-fine-pitched circuit layer 132 at the first side 130a of the respective third redistribution segment 130 may be physically and electrically connected to the fine-pitched circuit layer 122 of the second RDL 120.

In some embodiments, the first RDL 110 includes dielectric layers 111 and coarse-pitched circuit layers 112 stacked in sequence, where the coarse-pitched circuit layers 112 may include conductive features such as conductive lines, conductive vias, conductive pads, etc. The material(s) of the dielectric layers 121 of the second RDL 120 and the material(s) of the dielectric layers 111 of the first RDL 110 may be different from the material(s) of the dielectric layers 131 of the third redistribution segments 130. For example, the material(s) of the dielectric layers 121 of the second RDL 120 may include polyimide (PI), benzocyclobutene (BCB), polybenzoxazole (PBO) and/or other suitable dielectric material(s), and the material(s) of the dielectric layers 111 of the first RDL 110 may include ABF, PP and/or other suitable dielectric material(s). The material(s) of the fine-pitched circuit layers 122 of the second RDL 120 and the material(s) of the coarse-pitched circuit layers 112 of the first RDL 110 may be the same as or similar to the material(s) of the ultra-fine-pitched circuit layers 132 of the third redistribution segments 130.

The fine-pitched circuit layers 122 of the second RDL 120 may be electrically connected to the coarse-pitched circuit layers 112 of the first RDL 110 and the ultra-fine-pitched circuit layers 132 of the third redistribution segments 130. In some embodiments, the dimensions of the conductive features (e.g., conductive lines, conductive vias, and conductive pads) of the coarse-pitched circuit layers 112 may be greater than those of the conductive features (e.g., conductive lines, conductive vias, and conductive pads) of the fine-pitched circuit layers 122, respectively. The dimensions of the conductive features of the fine-pitched circuit layers 122 may be greater than the dimensions of the conductive features (e.g., conductive lines, conductive vias, and conductive pads) of the ultra-fine-pitched circuit layers 132, respectively. For example, the line/spacing of the conductive features of the coarse-pitched circuit layers 112 may be greater than the line/spacing of the conductive features of the fine-pitched circuit layers 122, and the line/spacing of the conductive features of the fine-pitched circuit layers 122 may be greater than the line/spacing of the conductive features of the ultra-fine-pitched circuit layers 132. The wiring layout density of the coarse-pitched circuit layers 112 in a unit area may be less than the wiring layout density of the fine-pitched circuit layers 122 in the same unit area, and the wiring layout density of the fine-pitched circuit layers 122 in a unit area may be less than the wiring layout density of the ultra-fine-pitched circuit layers 132 in the same unit area. That is, the wiring layout density of the ultra-fine-pitched circuit layer 132 per unit area is the greatest among the circuit layers of the integrated substrate, followed by the fine-pitched circuit layer 122, and the coarse-pitched circuit layer 112 has the smallest wiring layout density per unit area.

In some embodiments, a first protective layer 141 may be disposed on the first side 110a of the first RDL 110 to protect the coarse-pitched circuit layer 112 of the first RDL 110. In some embodiments, a second protective layer 142 may be disposed on the second side 120b of the second RDL 120 and the second sides 130b of the third redistribution segments 130 to protect the fine-pitched circuit layer 122 of the second RDL 120 and the ultra-fine-pitched circuit layers 132 of the third redistribution segments 130. The first protective layer 141 and the second protective layer 142 may be or may include a solder mask. In some embodiments, the outermost one of the coarse-pitched circuit layers 112 may be exposed by the first protective layer 141 to facilitate subsequent electrical connections. The outermost one of the ultra-fine-pitched circuit layers 132 may be exposed by the second protective layer 142, and the outermost one of the fine-pitched circuit layers 122 may also be optionally exposed by the second protective layer 142 to facilitate subsequent electrical connections.

In some embodiments, first connectors 151 may be disposed on the portions (such as the conductive pads) of the coarse-pitched circuit layer 112 exposed by the first protective layer 141 to be electrically connected to the first RDL 110. Second connectors 152 may be disposed on the portions of the ultra-fine-pitched circuit layer 132 exposed by the second protective layer 142 (and/or the outermost one of the fine-pitched circuit layers 122), and the second connectors 152 may be electrically coupled to the circuitries underlying the second protective layer 142 through the conductive vias penetrating through the second protective layer 142. In some embodiments, the second connectors 152 may be electrically coupled to the fine-pitched circuit layers 122 directly through conductive vias (not shown) penetrating through the second protective layer 142 and portions of the dielectric layers 121. That is, the second connectors 152 may be electrically coupled to the fine-pitched circuit layers 122 without passing through the third redistribution segments 130. The dimensions of the first connectors 151 may be greater than the dimensions of the second connectors 152. For example, the first connectors 151 may be solder balls, ball grid array, and/or other suitable conductive terminals, and the second connectors 152 may be conductive bumps with (or without) solder caps, controlled collapsed chip connection (C4) bumps, and/or other suitable conductive terminals.

In some embodiments, the integrated substrate 100 may further include a signal-transmitting component 160 embedded in the second RDL 120. For example, the signal-transmitting component 160 may be or include optical elements (e.g., optical waveguides, lenses, optical sensors, optical fibers, etc.) and/or any element that may be used for optical connection and optical data communication. In some embodiments, the placement (or formation) of the signal-transmitting component 160 may be combined with the formation process of the redistribution layer, so that the signal-transmitting component 160 is formed to be a layer in the second RDL 120, so as to achieve high-bandwidth and high-performance signal transmission. For example, the signal-transmitting component 160 may be completely covered by the dielectric layer 121 of the second RDL 120. In other embodiments, the signal-transmitting component 160 may include any element to transmit signals by means other than optical. Alternatively, the signal-transmitting component 160 may be omitted.

Referring to FIG. 4 and with reference to FIG. 3, the manufacturing method S100 may include at least the following steps. At the step S102, a RDL is formed over the first temporary carrier by using a back-end of line (BEOL) process. For example, a release layer may be formed on the first temporary carrier first, and then the RDL may be formed on the release layer to facilitate the subsequent separation step. In other embodiments, the release layer may be omitted. In some embodiments, the RDL may include dielectric layers and ultra-fine-pitched circuit layers stacked in sequence (as the dielectric layers 131 and the ultra-fine-pitched circuit layers 132 shown in FIG. 3). Next, at the step S104, the RDL formed over the first temporary carrier may be divided into a plurality of redistribution segments spaced apart from one another (as the third redistribution segments 130 shown in FIG. 3). For example, etching, drilling, and/or other suitable removal processes may be used to remove part of the RDL to form the redistribution segments over the first temporary carrier.

Next, at the step S106, another RDL may be formed over the redistribution segments by using a wafer-level packaging process. For example, the RDL (as the second RDL 120 shown in FIG. 3) including dielectric layers and fine-pitched circuit layers stacked in sequence may be formed over the first temporary carrier to cover the redistribution segments, where the fine-pitched circuit layers and the ultra-fine-pitched circuit layers of the redistribution segments are electrically connected to one another, and the bottommost portion of the second RDL 120 (i.e. the second side 120b) facing the first temporary carrier may be coplanar with the bottommost portions (e.g. the second side 130b) of those third redistribution segments 130 facing the first temporary carrier. Next, at the step S108, yet another RDL may be formed over the another RDL by using lamination, drilling and metal patterning processes. For example, as shown in FIG. 3, the first RDL 110 may be formed on the second RDL 120, where the dielectric layers 111 and the coarse-pitched circuit layers 112 of the first RDL 110 may be formed by the process similar to the PCB manufacturing process. One of ordinary skill in the art should be aware that there are considerable differences between the PCB manufacturing process, wafer-level packaging process, and the BEOL processes (e.g., the differences include circuit accuracy, material selection, process environment, operating temperature, etc.), so the details of those differences are not elaborated for the brevity.

Next, at the step S110, a first protective layer is formed over the yet another RDL. For example, as shown in FIG. 3, the first protective layer 141 may be formed on the dielectric layer 111 of the first RDL 110 to protect the circuitries in the first RDL 110. Next, at the step S112, the resulting structure is separated from the first temporary carrier and placed on the second temporary carrier. For example, the release layer may be irradiated to lose its adhesion, thereby separating the first temporary carrier from the resulting structure formed thereon. Other stripping process (e.g., grinding, etching, mechanical stripping, etc.) may also be used to remove the first temporary carrier to expose the second RDL 120 and the third redistribution segments 130. Subsequently, the first RDL 110 is placed over the second temporary carrier. The release layer may be formed on the second temporary carrier to facilitate the subsequent de-bonding process. In some embodiments, the first temporary carrier is removed before the resulting structure is placed over the second temporary carrier. In other embodiments, the resulting structure may be placed over the second temporary carrier before removing the first temporary carrier.

Next, at the step S114, a second protective layer is formed over the redistribution segments and the another RDL. For example, as shown in FIG. 3, the second protective layer 142 is formed on the dielectric layer 121 of the second RDL 120 and the third redistribution segments 130 to protect the circuitries in the second RDL 120 and the third redistribution segments 130. In some embodiments, before forming the second protective layer 142, the signal-transmitting component 160 may be disposed inside the second RDL 120. In other embodiments, before forming the second RDL 120, the signal-transmitting component 160 may be disposed next to the third redistribution segments 130, and then when forming the second RDL 120, the dielectric layer 121 covers the signal-transmitting component 160 and the third redistribution segments 130 at the same time.

Subsequently, the second connectors 152 and the conductive vias connected to the second connectors 152 and the underlying circuities may be formed on the second protective layer 142, so that the second connectors 152 are electrically connected to the second RDL 120 and the third redistribution segments 130. Subsequently, at the step S116, the second temporary carrier is removed. The second temporary carrier may be removed in the same or similar manner as the removal of the first temporary carrier to expose the first protective layer 141. In some embodiments, the removal process (e.g., etching, drilling, etc.) may be used to form a plurality of openings in the first protective layer 141 to expose the uppermost one of the coarse-pitched circuit layers 112, and then the first connectors 151 may be formed in these openings to be electrically connected to the coarse-pitched circuit layer 112. In other embodiments, the first protective layer 141 and/or the first connectors 151 may be omitted. Up to here, the fabrication of the integrated substrate 100 is substantially complete.

Figure 5:
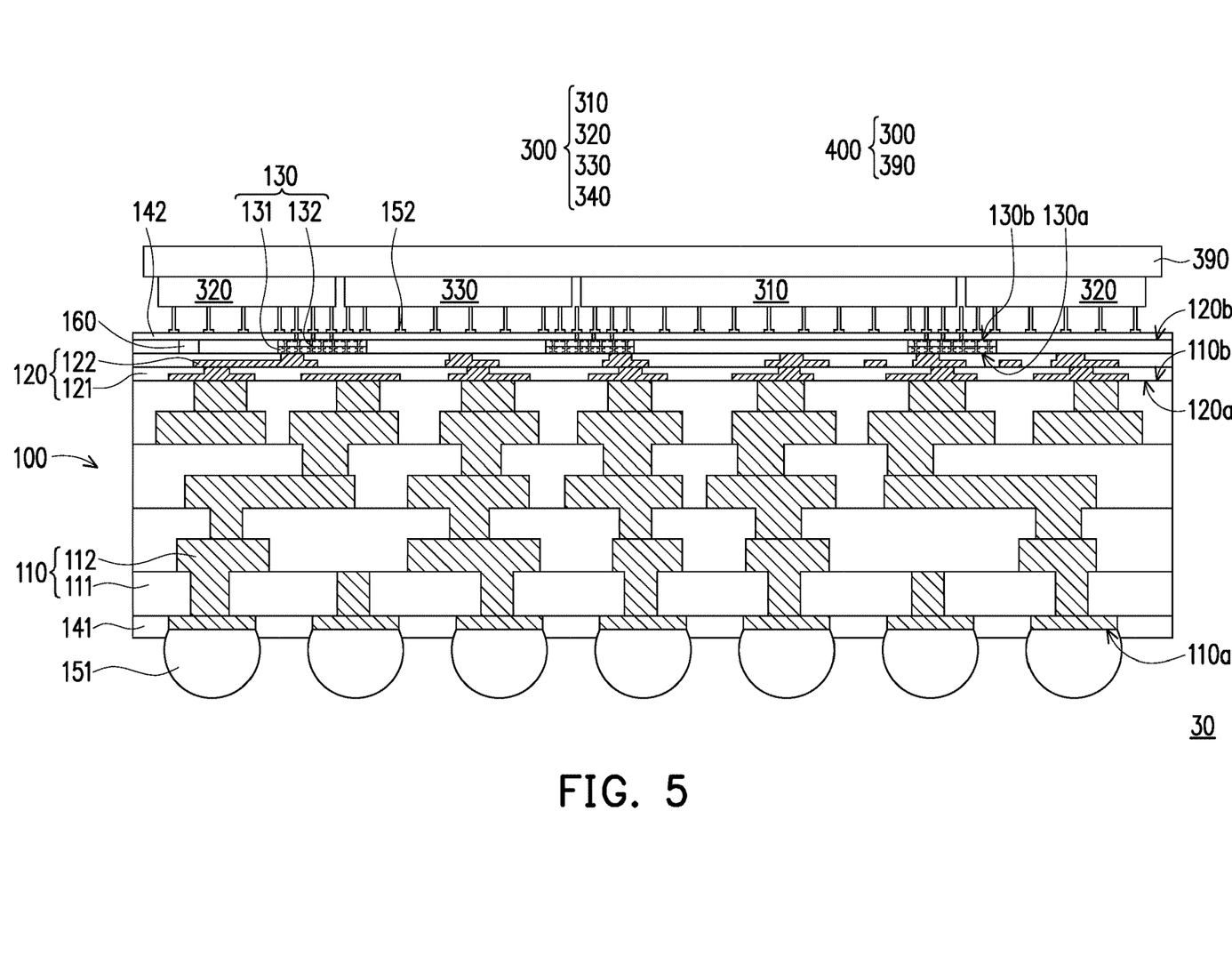
FIG. 5 is a schematic cross-sectional view of a semiconductor device including an integrated substrate according to some embodiments of the present invention.
Figure 6:
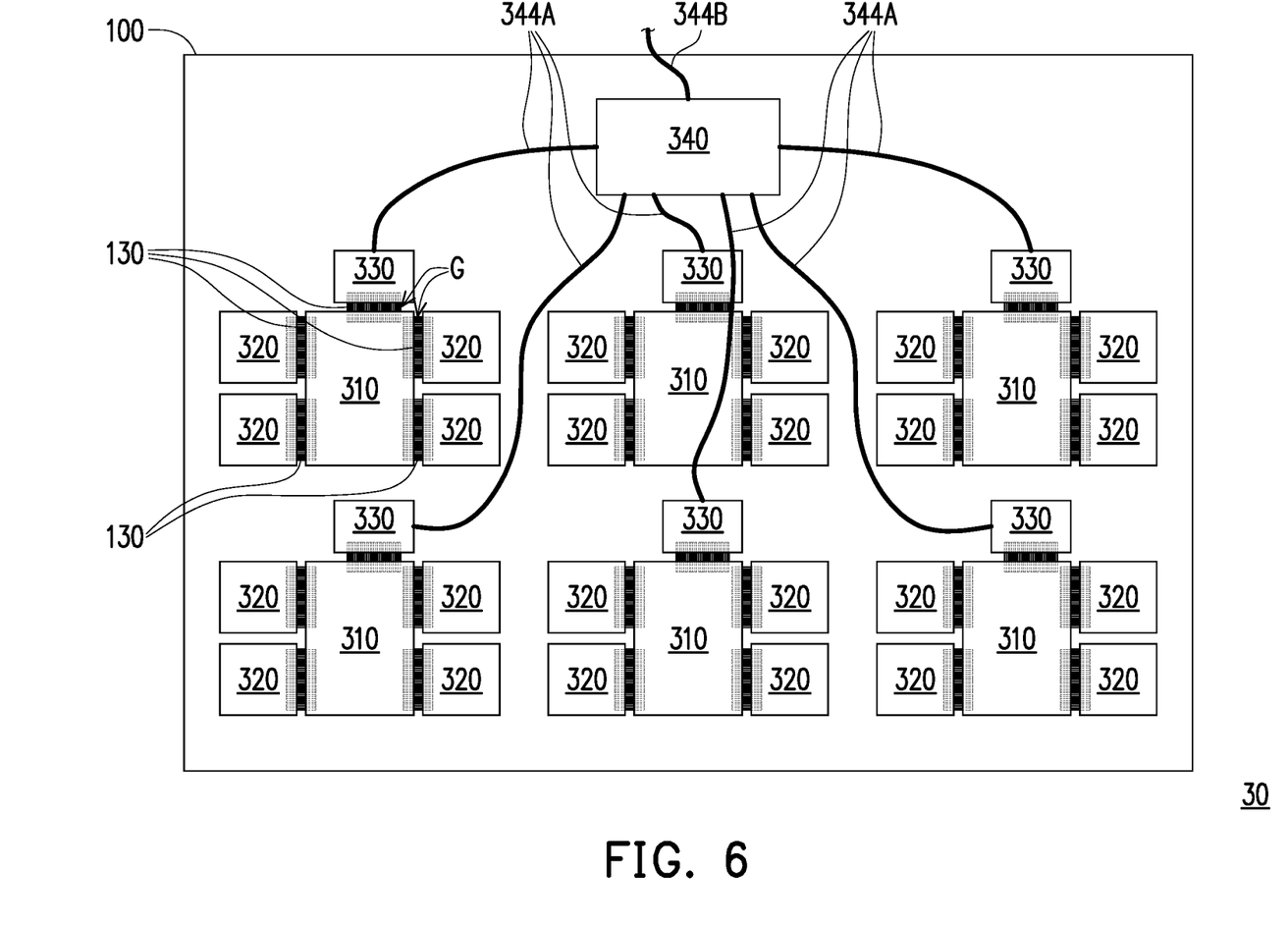
FIG. 6 is a schematic top view of a semiconductor device including an integrated substrate according to some embodiments of the present invention.

FIG. 5 is a schematic cross-sectional view of a semiconductor device including an integrated substrate according to some embodiments of the present invention, and FIG. 6 is a schematic top view of a semiconductor device including an integrated substrate according to some embodiments of the present invention. It should be noted that the integrated substrate shown in FIG. 5 is similar to the integrated substrate shown in FIG. 3, so the same/similar reference numerals refer to the same/similar components, and the details are not repeated herein. For clear indication, the substrate 390 is omitted in FIG. 6.

Referring to FIG. 5 and FIG. 6, a package structure 400 may be disposed on the integrated substrate 100 to form a semiconductor device 30. For example, the package structure 400 includes a plurality of chips 300 mounted on a substrate 390. In some embodiments, the package structure 400 is a heterogeneous integration package. These chips 300 are between the substrate 390 and the integrated substrate 100. These chips 300 are disposed on the chip end of the integrated substrate 100 (that is, disposed over the second side 120b of the second RDL 120 and the second sides 130b of the third redistribution segments 130) and these chips 300 are electrically coupled to the second RDL 120 and the third redistribution segments 130 through the second connectors 152. These chips 300 may be connected to the integrated substrate 100 by using flip-chip bonding or other suitable connection methods. In some embodiments, adjacent ones of the chips 300 may be interconnected with one another through the third redistribution segments 130 of the integrated substrate 100, thereby reducing signal transmission paths and realizing high-performance signal transmission.

These chips 300 may be or may include any suitable integrated circuit (IC) chips, such as processor chips (e.g., central processing units, graphics processing units, microprocessors, signal processors, etc.), memory chips (e.g., volatile memory chips, non-volatile memory chips, flash memory chips, etc.), logic chips (e.g., application-specific integrated circuits, analog-to-digital converter chips, etc.), optical-electrical (OE) chips, networking chips, sensor chips, radio frequency (RF) chips, driver chips, and/or the like. In some embodiments, the chips 300 may be divided into multiple groups, and each group of the chips includes at least one processor chip 310, a plurality of memory chips 320, at least one OE chip 330, and so on. For example, in a top view (as shown in FIG. 6), the OE chip 330 may be disposed at one side of the processor chip 310, and the memory chips 320 may be arranged at another two opposing sides of the processor chip 310. The processor chip 310, the memory chips 320, and the OE chip 330 in a group of the chips may be spatially separated from one another. For example, a gap G is between the processor chip 310 in the group of the chips and the OE chip 330 disposed next to the processor chip 310, and the gap G is also between the processor chip 310 and the respective memory chip 320 arranged at both sides.

Each of the third redistribution segments 130 of the integrated substrate 100 is located below one of the gaps G. In some embodiments, in the group of the chips, the memory chips 320 arranged at the two opposite sides of the processor chip 310 may be interconnected to the processor chip 310 through the ultra-fine-pitched circuit layers 132 of the third redistribution segments 130, respectively. The third redistribution segments 130 may also extend toward the OE chip 330 and the processor chip 310 to partially overlap the OE chip 330 and the processor chip 310. One of the third redistribution segments 130 of the integrated substrate 100 may be located at the gap G between the processor chip 310 and one of the memory chips 320 and extend toward the processor chip 310 and the one of the memory chips 320 to partially overlap the processor chip 310 and the one of the memory chips 320. In those overlapping parts, the connecting terminals of the chips may be connected to the ultra-fine-pitched circuit layers 132 of the third redistribution segments 130. For example, the respective memory chip 320 and the processor chip 310 in the group of the chips may be configured to transmit the signals only through the ultra-fine-pitched circuit layers 132 of the third redistribution segments 130 without transmitting through other RDLs in the integrated substrate, thereby shortening the signal transmission paths. In some embodiments, adjacent two of the memory chips 320 may be interconnected through the third redistribution segment 130 located below these two memory chips 320.

These chips 300 may also include at least one networking chip 340. The networking chip 340 may be disposed over the second RDL 120 of the integrated substrate 100 and does not overlap the third redistribution segments 130. In other embodiments, the networking chip 340 may also partially overlap at least one third redistribution segment 130. In some embodiments, the networking chip 340 may be connected to the OE chip 330 in each group of the chips. For example, a plurality of optical fibers 344A are disposed on the integrated substrate 100 and optically coupled to the networking chip 340 and the OE chip 330 in each group of the chips. In some embodiments, in one group of the chips, the OE chip 330 disposed next to the processor chip 310 may be interconnected with the processor chip 310 through the ultra-fine-pitched circuit layer 132 of the third redistribution segment 130. For example, the signals of the networking chip 340 are transmitted to the OE chip 330 in each group of the chips by the optical fiber 344A. The OE chip 330 may be configured to convert the optical signals into electrical signals, and then the electrical signals are transmitted to the processor chip 310 through the third redistribution segment 130 of the integrated substrate 100. The processor chip 310 may also transmit the electrical signals to the OE chip 330, and the OE chip 330 may be configured to convert the electrical signals into the optical signals and transmit the optical signals to the networking chip 340 through the optical fiber 344A. In some embodiments, the networking chip 340 may also be connected to other devices (e.g., another networking chip or an OE chip on another integrated substrate) through an optical fiber 344B. The use of the optical fibers 344A and 344B for interconnection may achieve high-bandwidth and high-performance information transmission. It should be understood that the configuration of the chips and the optical fibers shown in FIG. 5 and FIG. 6 are only illustrative, and the disclosure is not limited thereto.

Figure 7:
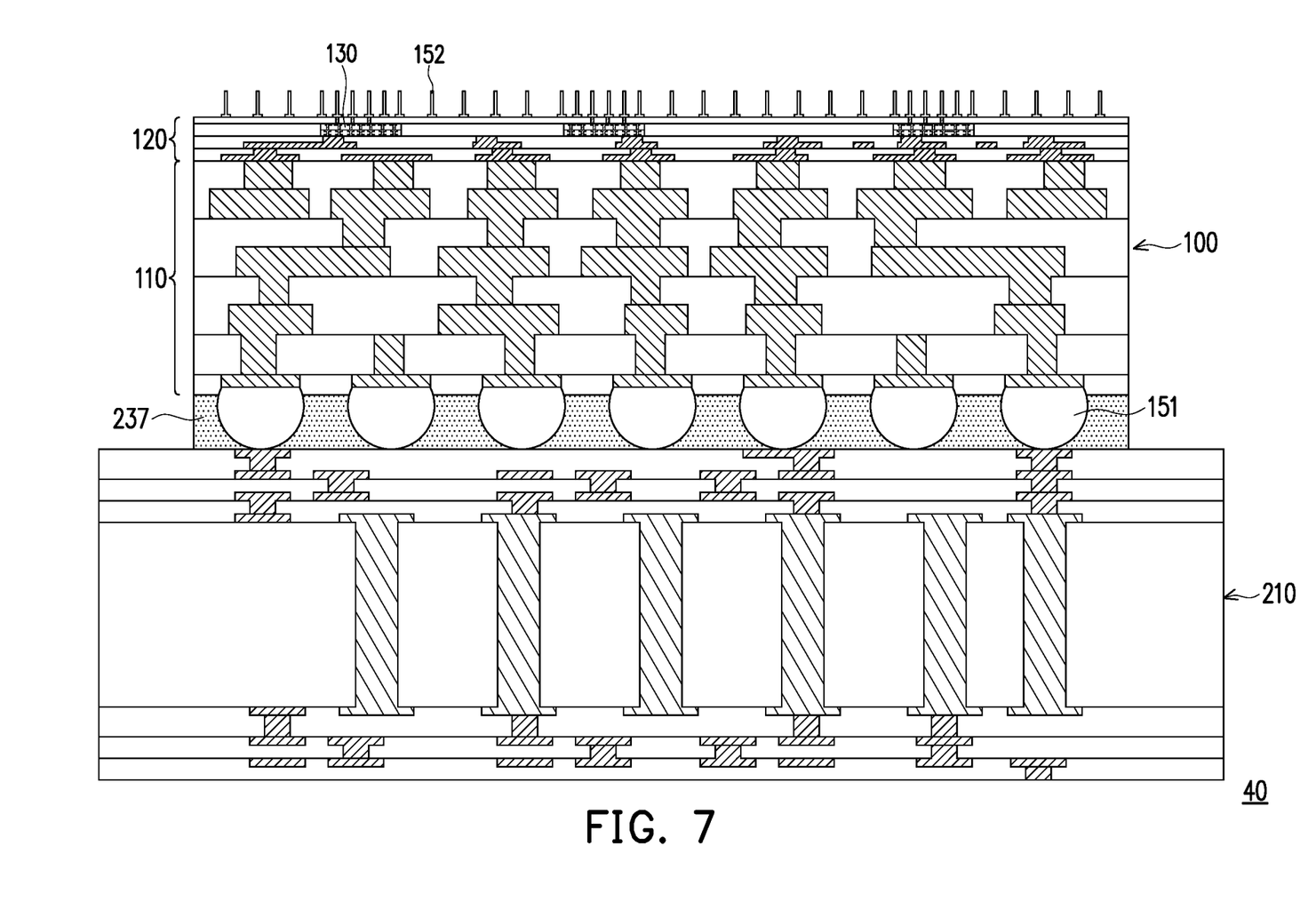
FIG. 7 is a schematic cross-sectional view of a semiconductor device including an integrated substrate and a circuit board according to some embodiments of the present invention.

FIG. 7 is a schematic cross-sectional view of a semiconductor device including an integrated substrate and a circuit board according to some embodiments of the present invention. It should be noted that the integrated substrate shown in FIG. 7 is similar to the integrated substrate 100 shown in FIG. 3, and the circuit board is similar to the circuit board 210 shown in FIG. 1, so the same/similar reference numerals refer to the same/similar components, and the details are not repeated herein. Referring to FIG. 7, a semiconductor device 40 includes the integrated substrate 100 and the circuit board 210, and the semiconductor device 40 is connected to the first RDL 110 of the integrated substrate 100 and the circuit board 210 through the first connectors 151 (e.g., solder balls). The underfill 237 may be optionally formed between the integrated substrate 100 and the circuit board 210 to cover the first connectors 151 for protection. The second connectors 152 may be located at the side of the integrated substrate 100 opposite to the first connectors 151 for further electrical connection. In some embodiments, the protective layer may be formed on the integrated substrate 100 to laterally cover the second connectors 152. In other embodiments, the protective layer may be omitted. For example, in an embodiment in which the semiconductor device 40 is used to test the wafer, the second connectors 152 may be in contact with the contact points on the wafer to transmit the test signals (as shown in FIG. 1). In other embodiments, a plurality of chips (or a package structure) may be arranged on the integrated substrate 100, and the second connectors 152 are used to connect these chips to the integrated substrate 100 (as shown in FIG. 5), so that these chips may be electrically coupled to the circuit board 210 through the integrated substrate 100.

Figure 8:
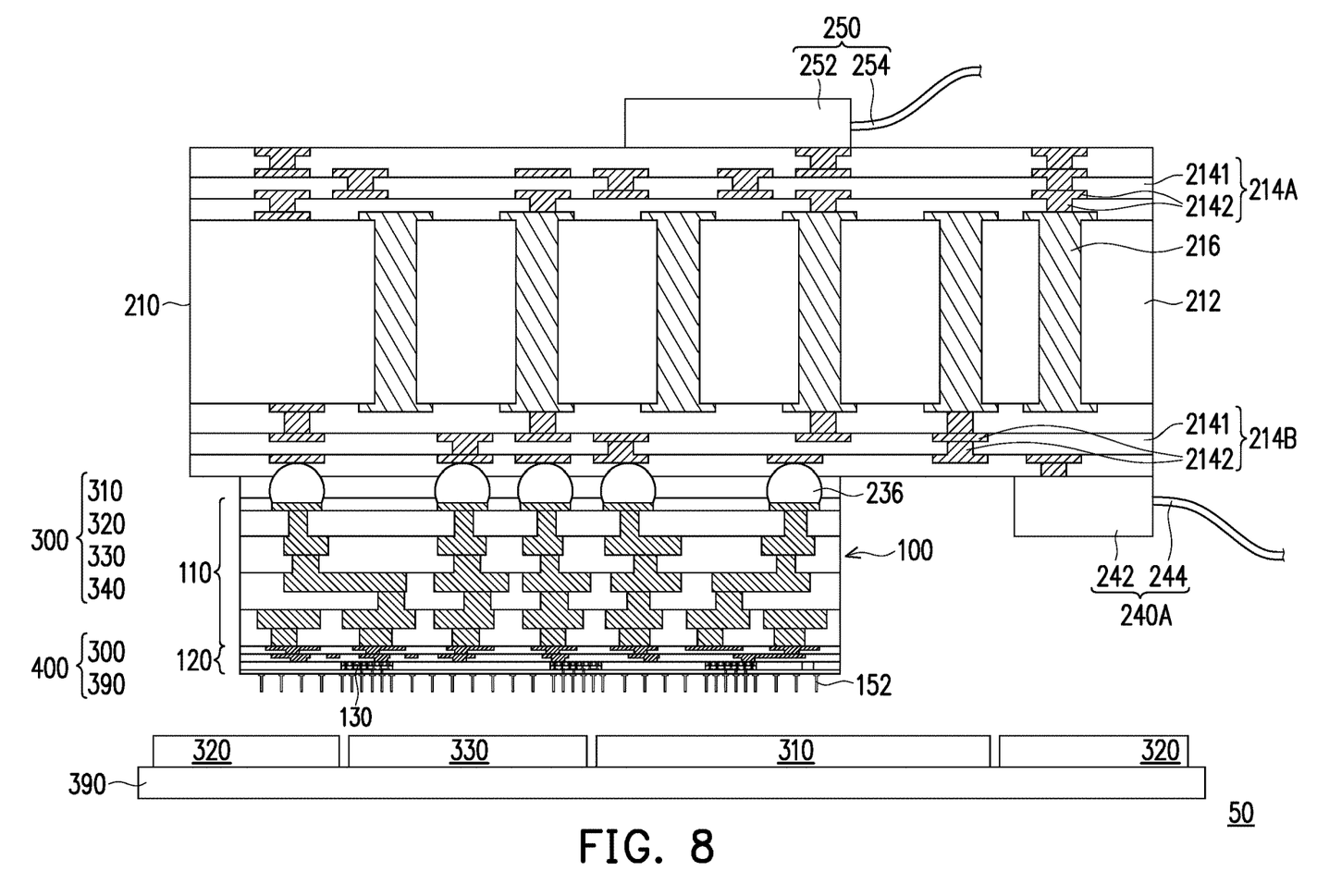
FIG. 8 is a schematic cross-sectional view of a semiconductor device including an integrated substrate and a circuit board according to some embodiments of the present invention.

FIG. 8 is a schematic cross-sectional view of a semiconductor device including an integrated substrate and a circuit board according to some embodiments of the present invention. It should be noted that the integrated substrate shown in FIG. 8 is similar to the integrated substrate 100 shown in FIG. 3, and the circuit board is similar to the circuit board 210 shown in FIG. 1, so the same/similar reference numerals refer to the same/similar components, and the details are not repeated herein. Referring to FIG. 8, a semiconductor device 50 includes the integrated substrate 100 and the circuit board 210, and the semiconductor device 50 is connected to the first RDL 110 of the integrated substrate 100 and the circuit board 210 through the first connectors 236 (e.g., solder balls). The underfill (not labeled) may be optionally formed between the integrated substrate 100 and the circuit board 210 to cover the first connectors 151 for protection. The second connectors 152 may be located at the side of the integrated substrate 100 opposite to the first connectors 151 for further electrical connection. In some embodiments, the protective layer may be formed on the integrated substrate 100 to laterally cover the second connectors 152. In other embodiments, the protective layer may be omitted. The semiconductor device 50 is used for test the device under test (DUT), for example, the package structure 400 (similar to the package structure 400 shown in FIG. 5). In other embodiments, the device under test (DUT) may be a semiconductor wafer (such as semiconductor wafer 10 shown in FIG. 1), which is not limited. In the present embodiment, the second connectors 152 may be viewed as integrated probes to be in contact with the contact points on the DUT to transmit the test signals. That is, the second connectors 152 is integrated with the integrated substrate 100, such that the plurality of probes (so called the second connectors 152) can be arranged and fabricated at once and the cost and difficulty for mounting the plurality of probes can be reduced.

In some embodiments, the integrated substrate 100 is replaceable, so that the semiconductor device 50 can be flexibly applied to testing of various DUTs and once the integrated substrate 100 or the second connectors 152 is broken, it is easily been replaced.

Although FIG. 8 shows that the semiconductor device 50 includes a signal-transmitting module 240A similar to the signal-transmitting module 240A shown in FIG. 1, but it is not limited. The semiconductor device 50 may include a signal-transmitting module similar to the signal-transmitting module 240B shown in FIG. 2.

Based on the above, the semiconductor device of the disclosure may be applied to perform a test on the semiconductor wafer by arranging the signal-transmitting module on the side close to the semiconductor wafer so as to shorten the signal transmission path, and the signal-transmitting module may be configured to improve the integrity and transmission speed of the test signals through suitable coupling mechanisms (e.g., optical coupling and electrical coupling, radio frequency transmission). In addition, the semiconductor device of the disclosure may be applied to the high performance computing system by arranging the optical fibers on the integrated substrate to use the optical signals as a signal transmission medium, thereby realizing high-bandwidth and high-performance information transmission. The disclosure also provides the manufacturing method for fabricating the integrated substrate, which may manufacture a plurality of redistribution segments with a plurality of ultra-fine-pitched circuit layers and integrate the ultra-fine-pitched circuit layers with the fine-pitched circuit layers and the coarse-pitched circuit layers of the redistribution layers. Therefore, the redistribution segments may provide interconnection paths between multiple chips arranged on the integrated substrate to shorten the signal transmission distance between the chips, and the integrated substrate may also provide the shorter signal-transmitting distance between the chips and the terminals.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device for testing a device under test, comprising:

a circuit board;

a plurality of probes disposed below the circuit board and facing the device under test;

an integrated substrate disposed between the circuit board and the plurality of probes, the plurality of probes being electrically coupled to the circuit board through the integrated substrate; and a signal-transmitting module disposed on the circuit board and next to the integrated substrate, wherein the signal-transmitting module transmits a test signal to the plurality of probes through the integrated substrate and the circuit board to perform a test to the device under test, wherein the integrated substrate comprises:

a first redistribution layer comprising a coarse-pitched circuit layer; and a second redistribution layer disposed on a side of the first redistribution layer close to the plurality of probes and comprising a fine-pitched circuit layer, wherein the fine-pitched circuit layer is electrically connected to the coarse-pitched circuit layer, wherein a dimension of the coarse-pitched circuit layer is greater than that of the fine-pitched circuit layer.

2. The semiconductor device according to claim 1, wherein the signal-transmitting module comprises an optical-electrical converter and an optical fiber connected to the optical-electrical converter.

3. The semiconductor device according to claim 1, wherein the signal-transmitting module comprises a radio frequency component.

4. The semiconductor device according to claim 1, further comprising:

a power supply component disposed on and electrically connected to the circuit board, wherein the power supply component and the signal-transmitting module are at two opposite sides of the circuit board.

5. The semiconductor device according to claim 1, wherein the plurality of probes is in contact with the second redistribution layer.

6. The semiconductor device according to claim 1, wherein the integrated substrate further comprises:

a plurality of third redistribution segments respectively embedded in the second redistribution layer, each of the third redistribution segments comprises an ultra-fine-pitched circuit layer, wherein the ultra-fine-pitched circuit layer is electrically connected to the fine-pitched circuit layer, and the dimension of the fine-pitched circuit layer is greater than a dimension of the ultra-fine-pitched circuit layer.

7. The semiconductor device according to claim 6, wherein a portion of the plurality of probes is electrically connected to portions of the ultra-fine-pitched circuit layer.

8. The semiconductor device according to claim 1, further comprising:

a holder body disposed below the circuit board, wherein the plurality of probes penetrates through the holder body.

9. The semiconductor device according to claim 1, wherein the plurality of probes is integrated with the integrated substrate.

10. The semiconductor device according to claim 1, wherein the device under test is a semiconductor wafer or a package structure.

11. The semiconductor device according to claim 10, wherein the package structure comprises a plurality of chips mounted on a substrate, and the plurality of chips comprises:

at least one group of chips comprising at least one processor chip, a plurality of memory chips and at least one optical-electrical chip; and at least one networking chip connected to the at least one optical-electrical chip in each the at least one group of chips.

12. The semiconductor device according to claim 1, wherein the integrated substrate is replaceable.

* * * * *